United States Patent [19]

Phillips

[11] Patent Number: 4,503,548

[45] Date of Patent: Mar. 5, 1985

[54] TIMER WITH FAST COUNTER INTERRUPT

[75] Inventor: Jesse C. Phillips, Stafford, Tex.

[73] Assignee: Texas Instruments Incorporated, Dallas, Tex.

[21] Appl. No.: 365,824

[22] Filed: Apr. 5, 1982

[51] Int. Cl.³ .................... H03K 21/14; G06M 3/02
[52] U.S. Cl. ............................................. 377/39
[58] Field of Search ..................................... 377/39

[56] References Cited

U.S. PATENT DOCUMENTS

| | | | |
|---|---|---|---|
| 4,001,699 | 1/1977 | Denny et al. | 377/39 |
| 4,079,234 | 3/1978 | Kashio | 377/39 |
| 4,089,060 | 5/1978 | Mitchell | 377/39 |
| 4,109,141 | 8/1978 | Sasaki | 377/39 |
| 4,145,748 | 3/1979 | Eichelberger et al. | 377/39 |
| 4,155,003 | 5/1979 | Grassme | 377/39 |
| 4,255,809 | 3/1981 | Hillman | 377/39 |
| 4,276,468 | 6/1981 | Nagamoto et al. | 377/39 |
| 4,365,202 | 12/1982 | Sinniger | 377/39 |

Primary Examiner—John S. Heyman
Attorney, Agent, or Firm—Thomas E. Tyson; Lee N. Heiting; Melvin Sharp

[57] ABSTRACT

A timer device includes a multiple bit storage circuit to store a numerical value as a series of binary bits and evaluation circuitry to simultaneously compare the value stored in the storage circuitry with a predetermined value. This invention further includes a counter circuit consisting of a multiple bit storage circuit to store an initial counter value, a counter circuit to receive the initial counter value and to decrement the counter in response to a clock signal and an evaluation circuit to produce an output when the counter value is identical to a circuit defined value.

3 Claims, 12 Drawing Figures

|   | BIT |   |   |   | LINE |   |   |   |
|---|---|---|---|---|---|---|---|---|
| 3 | 2 | 1 | 0 | 3 | 4 | 6 | 7 | 9 |
| 1 | 1 | 1 | 1 | 0 | 1 | 0 | 1 | 0 |
| 1 | 1 | 1 | 0 | 0 | 1 | 0 | 1 | 0 |
| 1 | 1 | 0 | 1 | 0 | 1 | 0 | 1 | 0 |
| 1 | 1 | 0 | 0 | 1 | 0 | 0 | 1 | 0 |
| 1 | 0 | 1 | 1 | 0 | 1 | 0 | 1 | 0 |
| 1 | 0 | 1 | 0 | 0 | 1 | 0 | 1 | 0 |
| 1 | 0 | 0 | 1 | 0 | 1 | 0 | 1 | 0 |
| 1 | 0 | 0 | 0 | 1 | 0 | 1 | 0 | 0 |
| 0 | 1 | 1 | 1 | 0 | 1 | 0 | 1 | 0 |
| 0 | 1 | 1 | 0 | 0 | 1 | 0 | 1 | 0 |
| 0 | 1 | 0 | 1 | 0 | 1 | 0 | 1 | 0 |
| 0 | 1 | 0 | 0 | 1 | 0 | 0 | 1 | 0 |
| 0 | 0 | 1 | 1 | 0 | 1 | 0 | 1 | 0 |
| 0 | 0 | 1 | 0 | 0 | 1 | 0 | 1 | 0 |
| 0 | 0 | 0 | 1 | 0 | 1 | 0 | 1 | 0 |
| 0 | 0 | 0 | 0 | 1 | 0 | 1 | 0 | 1 |

TIMER WITH FAST COUNTER INTERRUPT

BACKGROUND

1. Field of the Invention

This invention relates to timers with storage devices, circuitry to evaluate the value stored in the devices and more specifically, to counters with circuitry to determine when the counter has decremented to a 0 value.

2. Description of the Prior Art

Timers have been used in computer circuits for some time. The purpose of a timer is to determine the amount of time required to perform specific tasks in the computer. Another purpose for a timer is to prevent an excessive amount of time from being spent either while performing a task or awaiting for an event to occur. Timers for these purposes are called watchdog timers. The common mode of operation of watchdog timers is to load a set value into the counter and decrement this value according to some computer clock signal. If the counter decrements the initially loaded value to a 0 value, then an interrupt is generated by the timer circuitry. Therefore, if a computer is waiting for a certain event to occur and loads the watchdog timer with a set timer value in which the event is to occur, the timer will generate an interrupt when the specified time expires and the event does not occur.

An example of a timer or counter used in a computer circuitry is disclosed in U.S. patent application Ser. No. 253,643 filed 4/13/81 which is herein incorporated by reference. A diagram of a common counter is illustrated in FIG. 1. The initial value is loaded from the data bus into a latch which is, in turn, loaded into a counter circuit. The counter circuit will then decrement the initial value. When the counter value reaches a certain point, the evaluation circuitry connected to the counter circuit will initiate an interrupt. FIG. 2a illustrates the prior art evaluation circuitry for a 4 bit counter. The value in the Bit 0 Counter is loaded into NOR gate 10 by a line 1 where is is NORed with the value in Bit 1 Counter via line 2. The output of the NOR gate 10 is coupled to the inverter 11 via line 3 which is in turn coupled to NOR gate 12 via line 4. The other input to NOR gate 12, line 5, is coupled from the Bit 2 Counter. The output of NOR gate 12 on line 6 is coupled to inverter 7; the output of the inverter 7 is coupled to one of the two inputs for NOR gate 14; the second input for NOR gate 14 is coupled by line 8 to the Bit 3 Counter. The output of NOR gate 14 is on line 9 and becomes active when all bit counter values are 0. The transistor schematic of the evaluation circuit shown in FIG. 2a is illustrated in FIG. 2b. NOR gate 10 is shown to consist of a power source provided to the circuitry at point 15, a precharge device 16 connected to a precharge clock, an isolation device 16 connected to a precharge clock, an isolation device 17 connected to an isolation clock φ1, and two inputs, lines 1 and lines 2, provided to devices 18 and 19, respectively. Note that this is the standard dynamic circuit NOR gate. The output of this NOR gate line 3 is provided to inverter 11 which includes the power source at point 20 to precharge device 21 to precharge node 24 during φP2. Also provided is isolation device 22, clocked by φ2 with an input device 23 receiving its input on line 3. The inverter 11 output, line 4, is connected to NOR gate 12 which is similar to NOR gate 10. Likewise, the inverter 13 is similar to inverter 11 and NOR gate 14 is similar to NOR gates 12 and 10. The output of NOR gate 14 is line 9.

Referring to the truth table in FIG. 2c, if any of the bit positions in the bit counters 0 through 3 contain a 1, the output on line 9 will be a 0. However, if a 0 value exists in all four bit counter locations, a 1 will be output by the evaluation circuit on line 9.

Two problems exist with this type of evaluation circuitry. The first is that when the circuit is implemented in dynamic logic, a large number of transistor devices are required. The second is that several cycles are required for the values of the bit counters to clock through the serially connected logic as shown in FIG. 2a. In FIG. 2b, the value of NOR gate 10 is evaluated by the inverter 11 at a later precharge and isolation clock time. Therefore, several clocking cycles are required by the circuitry in order to clock the values through the NOR gate inverter evaluation circuit and to produce a valid output on line 9. It is an object of this invention to provide a timer that requires a smaller number of transistor devices while also providing a simultaneous evaluation of all bit counter values.

SUMMARY OF THE INVENTION

In accordance with this invention, a timer is provided that a storage device includes a multiple bit storage latch to store a numerical value as a plurality of binary bits. The timer further includes an evaluation circuit including a circuit defined value where the evaluation circuit provides an output when the value in the storage latch is identical to the circuit defined value. This is accomplished by the simultaneous comparison of the storage value with the circuit defined value.

In the preferred embodiment a counter is disclosed that includes a storage latch to store an initial counter value as a plurality of binary bits. Connected to this storage latch is a counter circuitry that receives the intial counter value and decrements this value in response to a clock signal. Further included in this counter is an evaluation circuit to determine if the counter value is equal to a circuit defined value. The evaluation circuit further includes circuitry to simultaneously compare each bit of the counter with a predetermined circuit value and to produce an output when the counter value is identical to the circuit defined value.

BRIEF DESCRIPTION OF THE DRAWINGS

The novel features believed characteristic of this invention are set forth in the appended claims; the invention itself as well as other features and advantages thereof may be best understood by referring to the following detailed descriptions of particular embodiments when read in reference to the accompanying drawings wherein:

FIG. 2b is a schematic diagram of the prior art evaluation circuitry in FIG. 2a.

DETAILED DESCRIPTION OF THE EMBODIMENT

Figure 1:
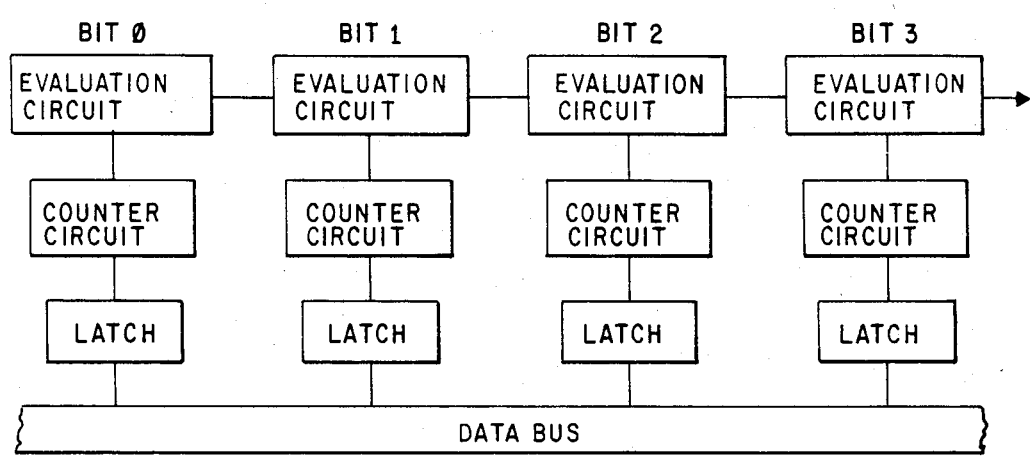
FIG. 1 is a block diagram of a counter.
Figure 2A:
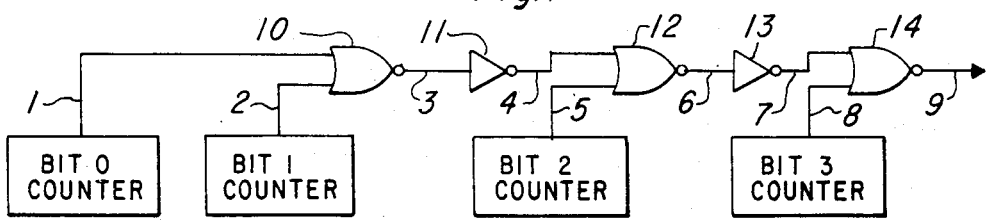
FIG. 2a is a schematic diagram of the prior art evaluation circuitry shown in FIG. 1.
Figure 2B:
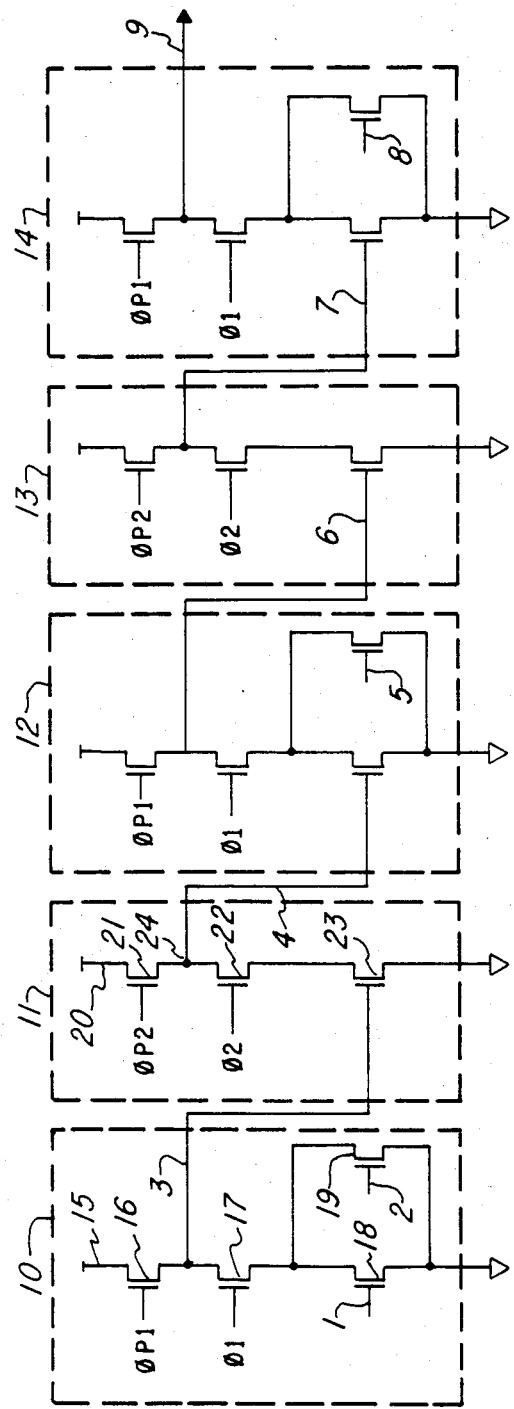
Figures 2C, 3:
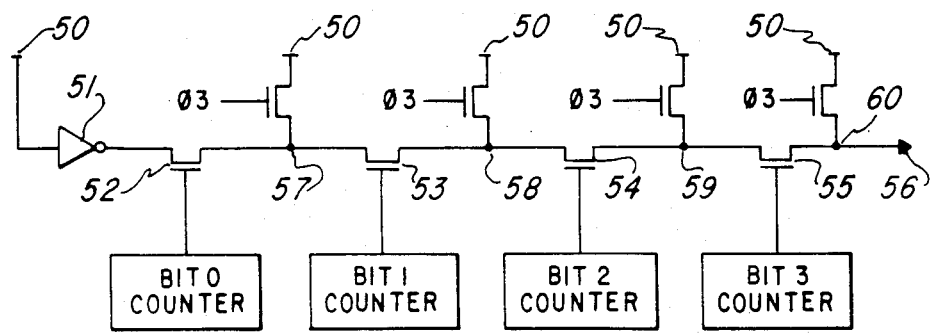
FIG. 2c is a truth table for the circuitry shown in FIG. 2b.
FIG. 3 is a transistor schematic diagram of the an evaluation circuit according to the invention.

A schematic of the simple form of an evaluation circuit is illustrated in FIG. 3. Devices 52, 53, 54 and 55 have gates connected to individual bits of the bit counter. These devices are serially connected to an inverter 51 which receives an input 50. In the preferred embodiment, the circuitry is implemented in PMOS (positive channel metal oxide silicon technology). Therefore a 0 is an active low signal. A "1" input into the circuitry at point 50 becomes a 0 after passing through inverter 51. Since point 50 is connected to the chip power supply, the output of inverter 51 will always be 0. Nodes 57, 58, 59 and 60 are discharged to clear the comparison circuitry before each compare during $\phi3$ from power supply 50 as shown. If the contents of the bit 0 count is a 0, the 0 will activate device 52 allowing the 0 from the inverter 51 to pass through to the next gate 53. If all four gates (52, 53, 54 and 55) are 0, then the output of the inverter 51, an active low "0", will be outputted on line 56. The discharge nodes 57, 58, 59 and 60 connected to the devices clocked by $\phi3$ will then discharge any residuary charge remaining on line 56 during the discharge cycle ($\phi3$) before the next comparison cycle.

Figure 4:
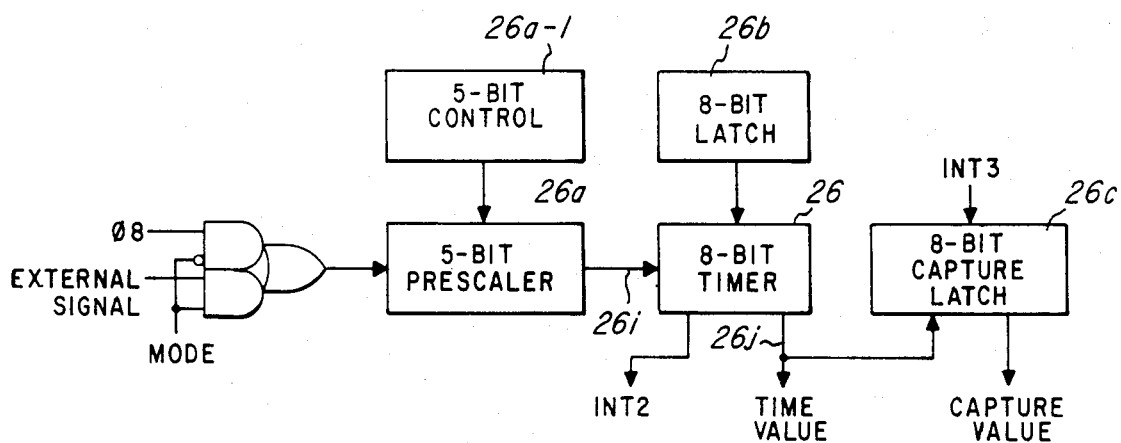
FIG. 4 is a block diagram of a timer incorporating the evaluation circuit of FIG. 3.

In the preferred embodiment, this evaluation circuit is implemented in a timer. A block diagram of the timer is illustrated in FIG. 4. This timer is identical to the timer illustrated in U.S. patent application Ser. No. 253,643, filed 4/13/81 referenced earlier. In order to more easily understand this invention implementation, the workings of the timer contained in the referenced U.S. patent application will be discussed briefly. The timer, in FIG. 4, contains three basic parts. The first is a prescaler shown as a prescaler counter 26a and control latch 26a-1. The 5 bit control latch 26a-1 is loaded with a 5 bit numerical value which determines the number of clocking pulses received by the timer before the timer decrements. For example, if the 5 bit control latch contains a 0, the timer will decrement upon receiving a clock signal. If the 5 bit control latch 26a-1 contains a 1, then the 8 bit timer 26 will decrement every two clock signals. The timer has disclosed as two modes: internal and external. In internal mode, the timer will receive a clock signal upon occurrence of $\phi8$ in the timer mode signal. In the external mode, the timer will decrement upon receiving some external signal. This allows the timer to use an external timing source. The 8 bit latch 26b contains the value to be decremented in the timer. This value is loaded into the 8 bit timer 26 and decremented from the prescaler 26a via line 26i. Note that when the timer value reaches 0, the interrupt 2, INT2 is raised. In addition, the value of the timer may be read by the user over a data bus accessing the 8 bit timer 26 via line 26j. Further, upon occurrence of an interrupt 3, INT3, the 8 bit capture latch 26c will store the value of the 8 bit timer at the occurrence of the interrupt. This feature is used to determine the time of some external event inputted through interrupt 3, NT3.

Figure 5:
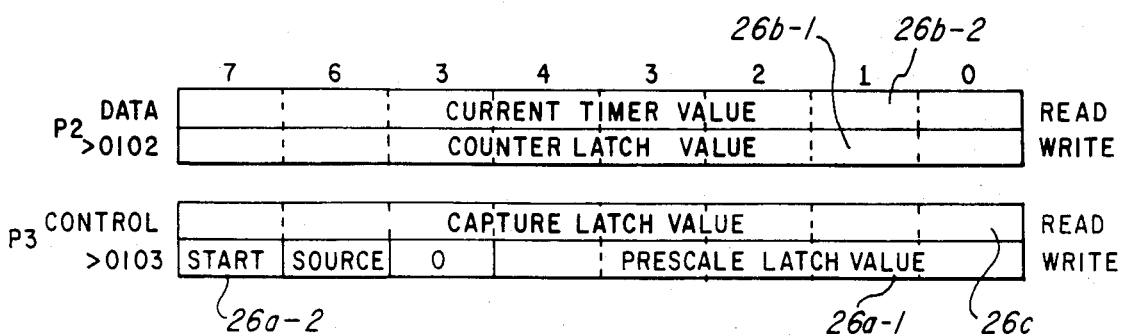
FIG. 5 is a diagram of the timer data and control registers.

FIG. 5 illustrates the reading and writing of the timer illustrated in FIG. 4. A read of memory location 0102 hex will read the current timer value 26b-2. Writing into memory location 0102 hex, will write the counter latch value 26b-1 into latch 26b. Reading memory location 0103 hex will read the capture latch value 26c. Writing into that memory location will write the source signal and the prescale latch value 26a-1.

Figure 6:
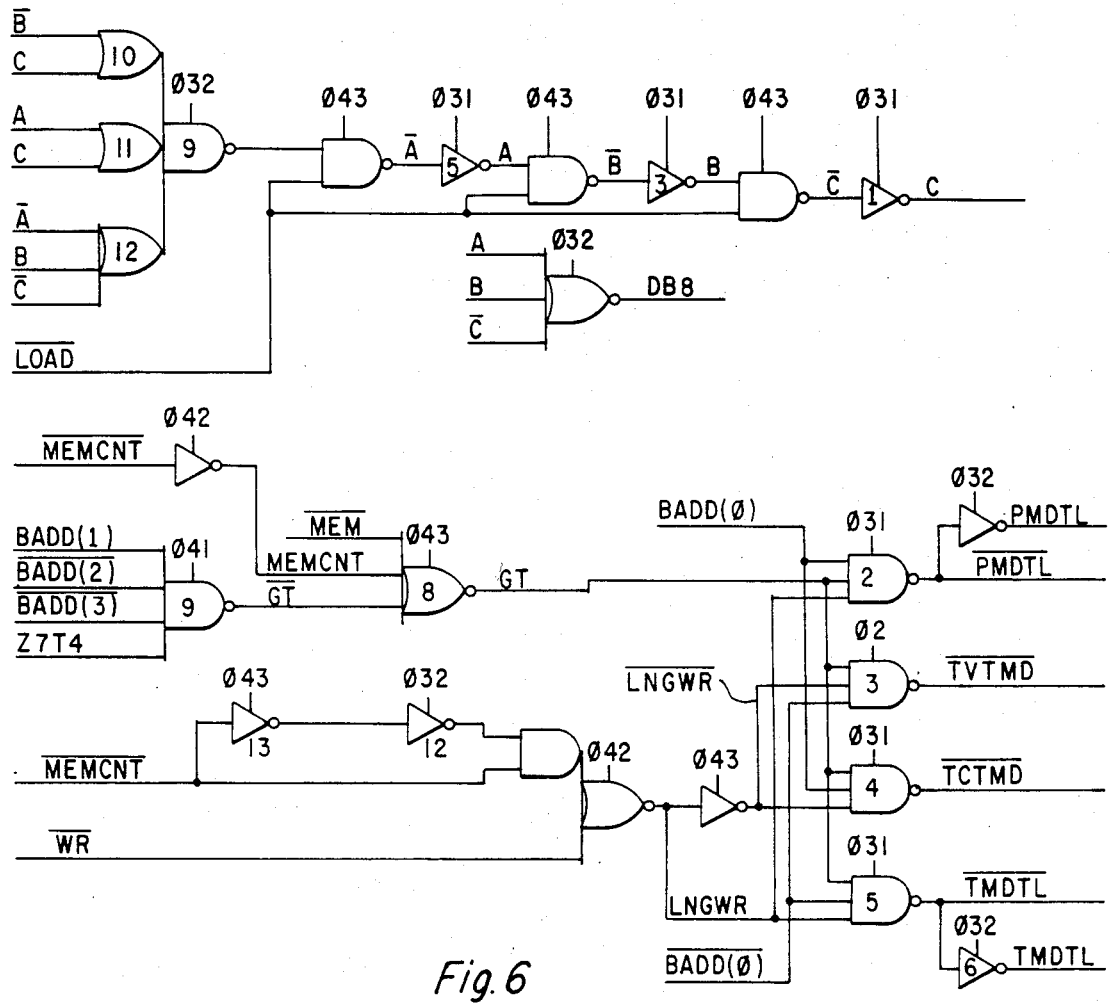
FIG. 6 is a schematic diagram of command signal circuitry for the timer shown in FIG. 4.

Some control circuitry for the timer is illustrated in FIG. 6. The load signal is input into a logic circuit that provides a number of signals marked A, B, C and their complements. A, B, C- are nored to produce the signal DB8 which represents the clock signal divided by 8. In other words, upon every 8 occurrences of the system clock, DB8 will become active. The remaining circuitry in FIG. 6 is circuitry to produce the control signals PMDTL, PMDTL-, TVTMD-, TCTMD-, TMCTL- and TMDTL. These signals control the functioning of the timer. PMDTL- loads the prescaler latch with the latch value from MD bus (system data bus). TVTMD- loads the MD bus with the timer value from the 8 bit timer 26 (FIG. 4). TCTMD loads the capture latch contents 26c (see FIG. 4) to the MD bus. TMDTL- loads the timer latch 26b from the MD bus. These control signals are the key control signals that cause the timer to function. These control signals merely result from commands in data that are loaded into the timer data and control registers as illustrated in FIG. 5. It should be apparent to one skilled in the art that other arrangements of control circuitry can be developed to generate the same control signals.

Figure 7:
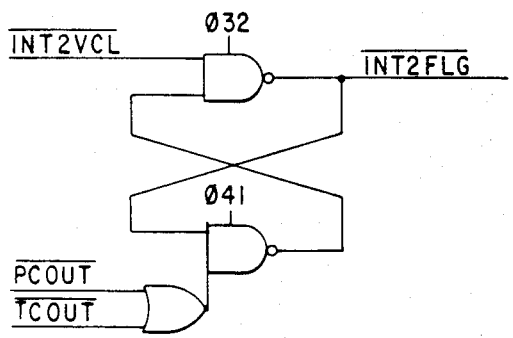
FIG. 7 is a schematic diagram of the timer circuitry in FIG. 4 that produces the output interrupt.

Interrupt 2 is generated by the timer when the timer decrements to "0". The actual circuitry for generating this interrupt is illustrated in FIG. 7. The circuitry receives the interrupt 2 enable signal (INT2VCL-) into an NAND gate clocked by $\phi32$. The prescaler counter output PCOUT- and timer counter output TCOUT- are inputted into a NOR gate which is in turn inputted into a NAND gate clocked by $\phi41$ and cross latched with the NAND gate clocked by $\phi3$-2. The output of the circuitry (an active low) is the interrupt 2 flag INT2FLG-.

Figure 8B:
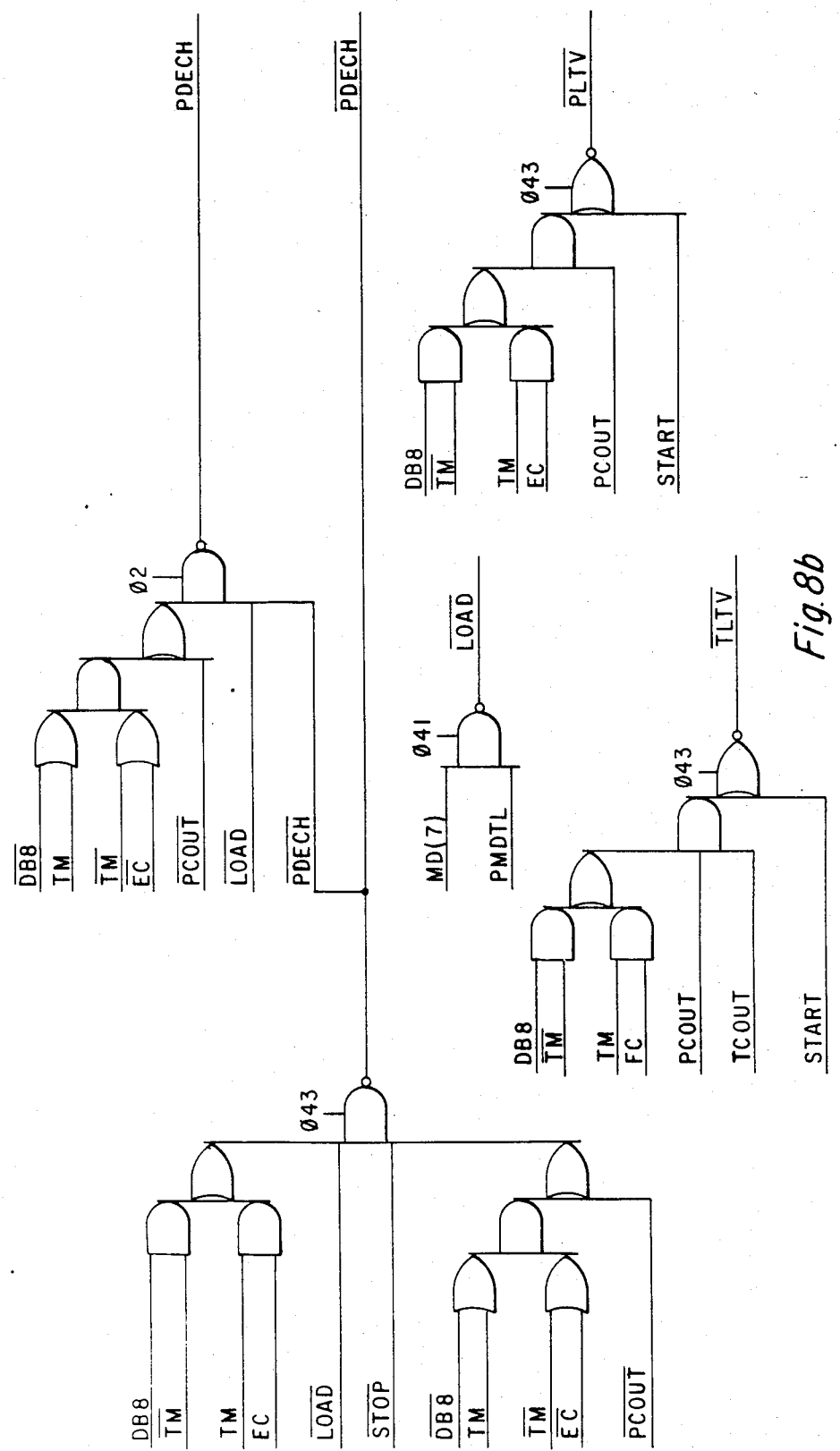
FIG. 8 is a schematic diagram of additional command signals for the timer shown in FIG. 4.
Figure 8A:
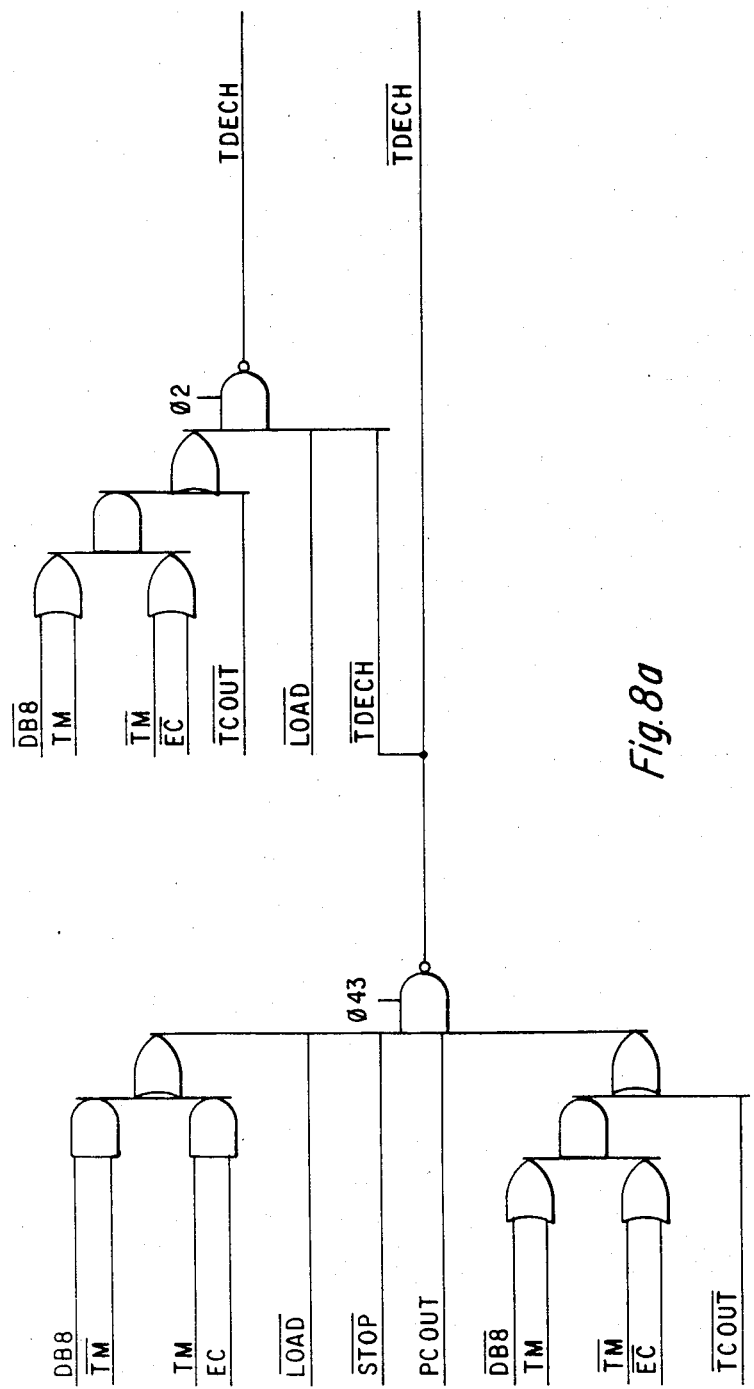

The remaining control circuitry for the timer is illustrated in FIG. 8. The control signals produced are timer decrement (TDECH and TDECH-), prescaler decrement (PDECH and PDECH-), load the prescaler (PLTV-), load the timer (TLTV-) and load prescaler and timer latches (LOAD-). The timer decrement signals result from the occurrence or nonoccurrence of several control signals including DB8 (previously explained), timer mode (TM), external event counter (EC), stop (STOP-) which is derived from the start bit 26q-2 in the timer control register at memory location hex 0103, PCOUT and PCOUT- (previously explained). The prescaler decrement signal (PDECH) and PDECH-) signals are generated as shown from a similar set of control signals. The load signal (LOAD) is generated from a NAND gate clocked by $\phi41$ receiving inputs from the 7th bit of the MD bus (which is the 7th bit of the control register 0103 hex) and the prescaler latch loading signal PMDTL previously explained. The two signals PLTV- and TLTV- which load the prescaler value from the latch and the timer value from the latch, respectively, are generated as shown. The start signal is derived from the 7th bit of the control register i.e., the start bit 264-2 in the timer control register.

Figure 9A:
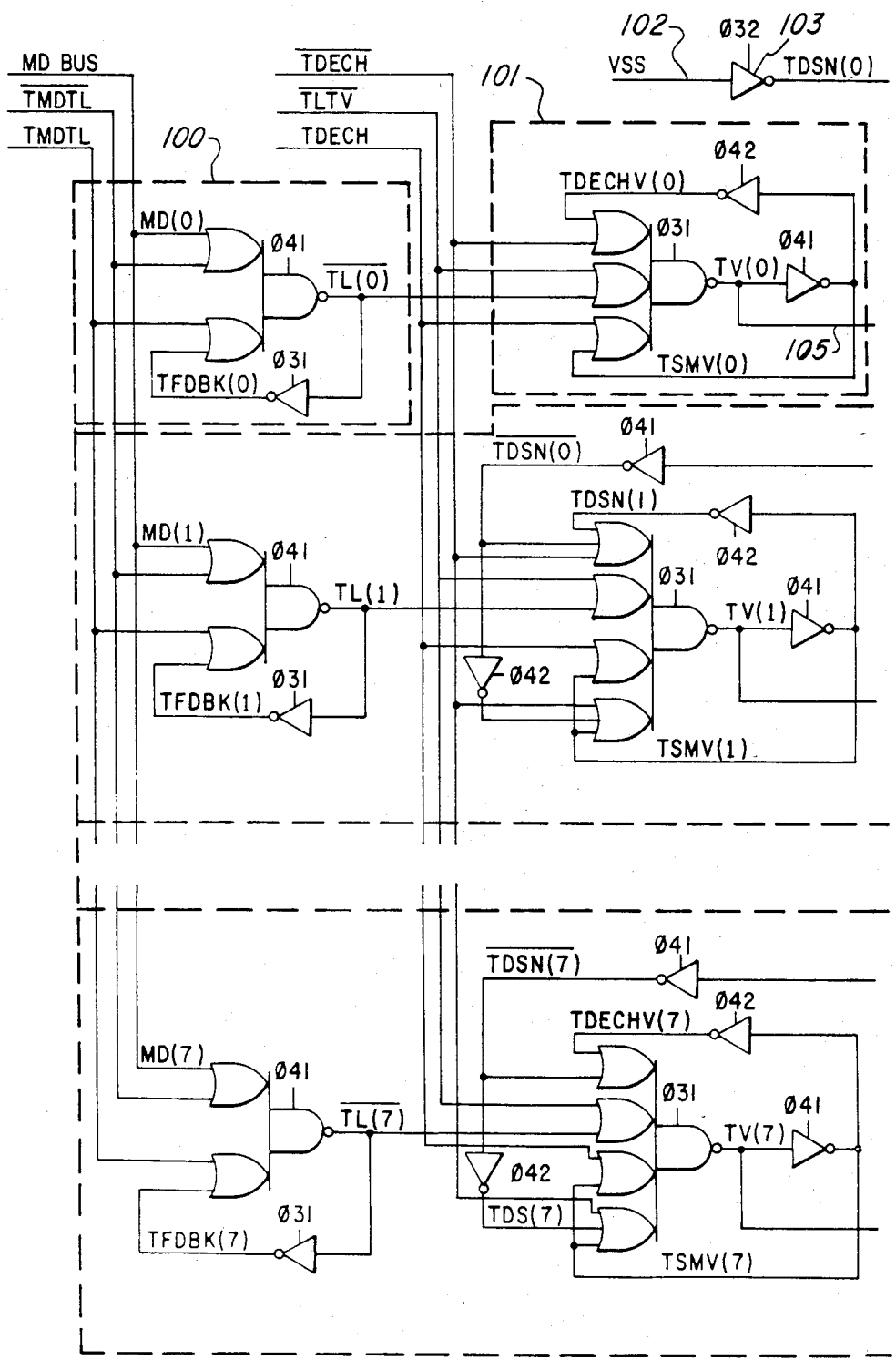
FIG. 9 is a schematic diagram of the 8 bit timer block 26 shown in FIG. 4.
Figure 9B:
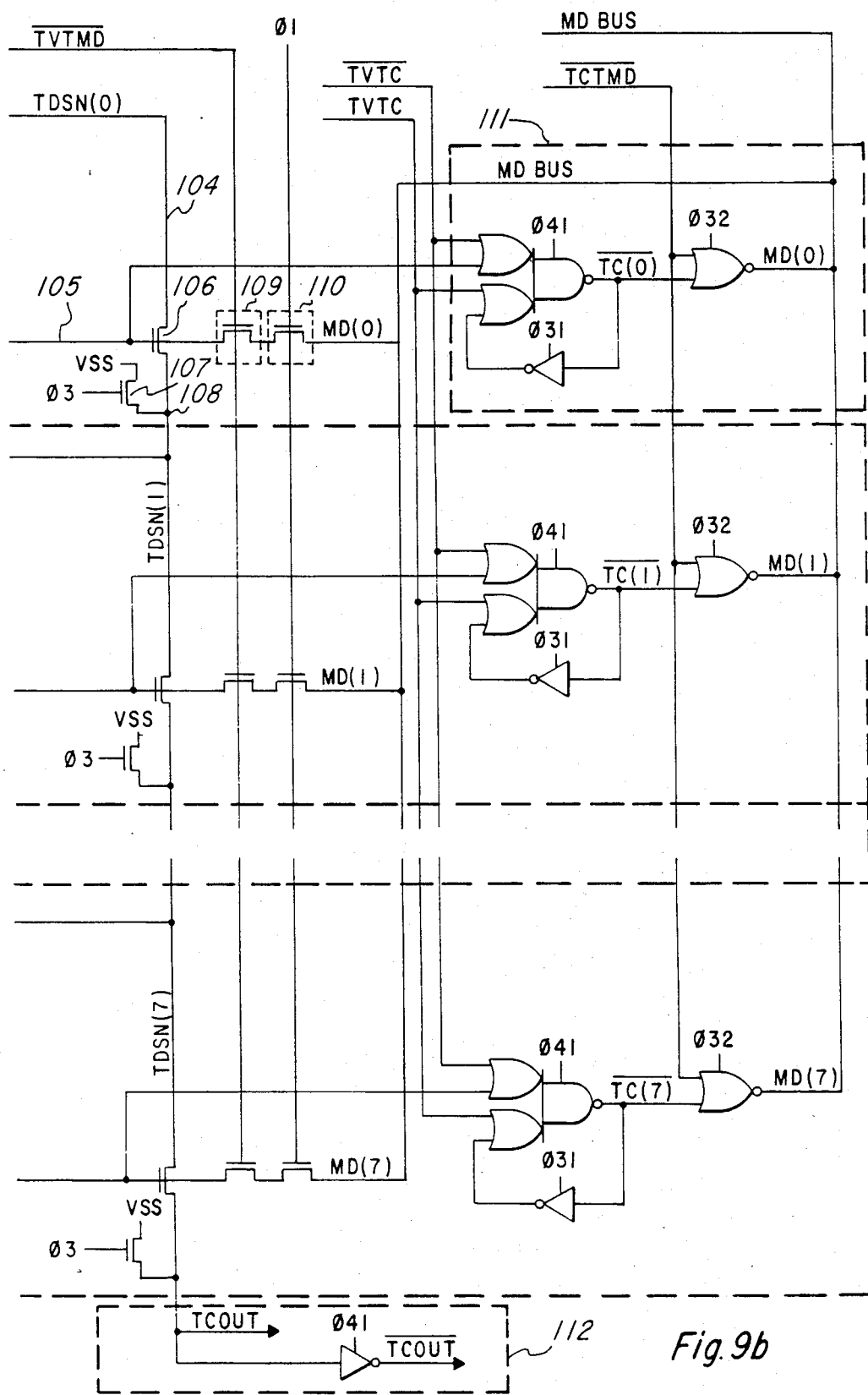

The 8 bit latch 26b, the 8 bit timer 26 and the 8 bit capture latch 26c (as shown in FIG. 4) are illustrated in FIG. 9. The individual bit latches are illustrated for three bits 0,1 and 7. Bits 2, 3, 4, 5 and 6 are similar to those illustrated, therefore, only bit 0 latch will be discussed. The bit 0 latch for 26b marked as 100 stores the latch value from the MD bus under control of the TMDTL and TMDTL- control signals. The output of this latch is TL (0)- and is inputted into the 8 bit timer latch 101. This latch 101 has two functions. The first function is to store the value from the 8 bit latch 100 under the control of the TLTV- control signal. The second function is to decrement the value stored under control of the TDECH and TDECH- control signals. The output of this bit latch 101 is TV(0) on line 105. Note that the output 105 is used as an input to a gate of device 106. Device 106 is part of the invention disclosed which is similar to the invention as shown in FIG. 3. Referring to FIG. 3, point 50 matches the Vss line 102 in FIG. 9. The inverter 51 in FIG. 3 is similar to the inverter 103 in FIG. 9. The purpose of this inverter is to place a high signal on line 104 which is gated through device 106 when the contents of the bit 0 latch 101 is a 0. Note that the node 108 which receives the active signal on line 104 is periodically discharged by device 107 during $\phi 3$. The output of this series of devices is TCOUT and TCOUT- from circuitry 112. This output is used to initiate the interrupt 2. The output of the bit 0 timer value latch 101 can be clocked to the MD bus via device 109 controlled by TVTMD and device 110 clocked by $\phi 1$. The contents of the timer value bit 0 latch 101 can also be stored into the capture latch bit 0 register 111 under control of TVTC and TVTC-. Note that the contents of this latch can be placed on the MD bus under the control of the TCTMD- signal.

Figure 10A:
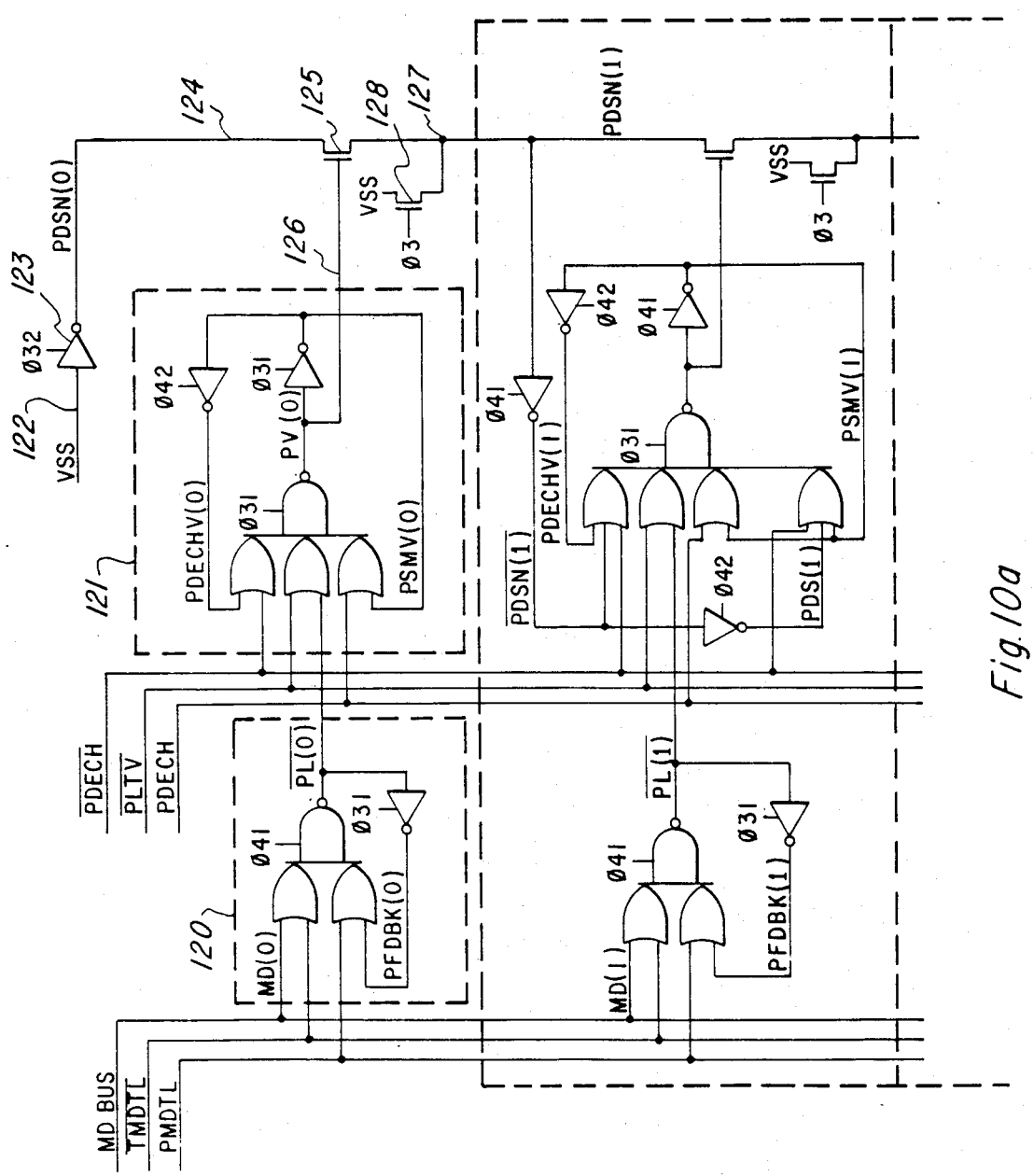
FIG. 10 is a schematic diagram of the 5 bit prescaler block 26a shown in FIG. 4.
Figure 10B:
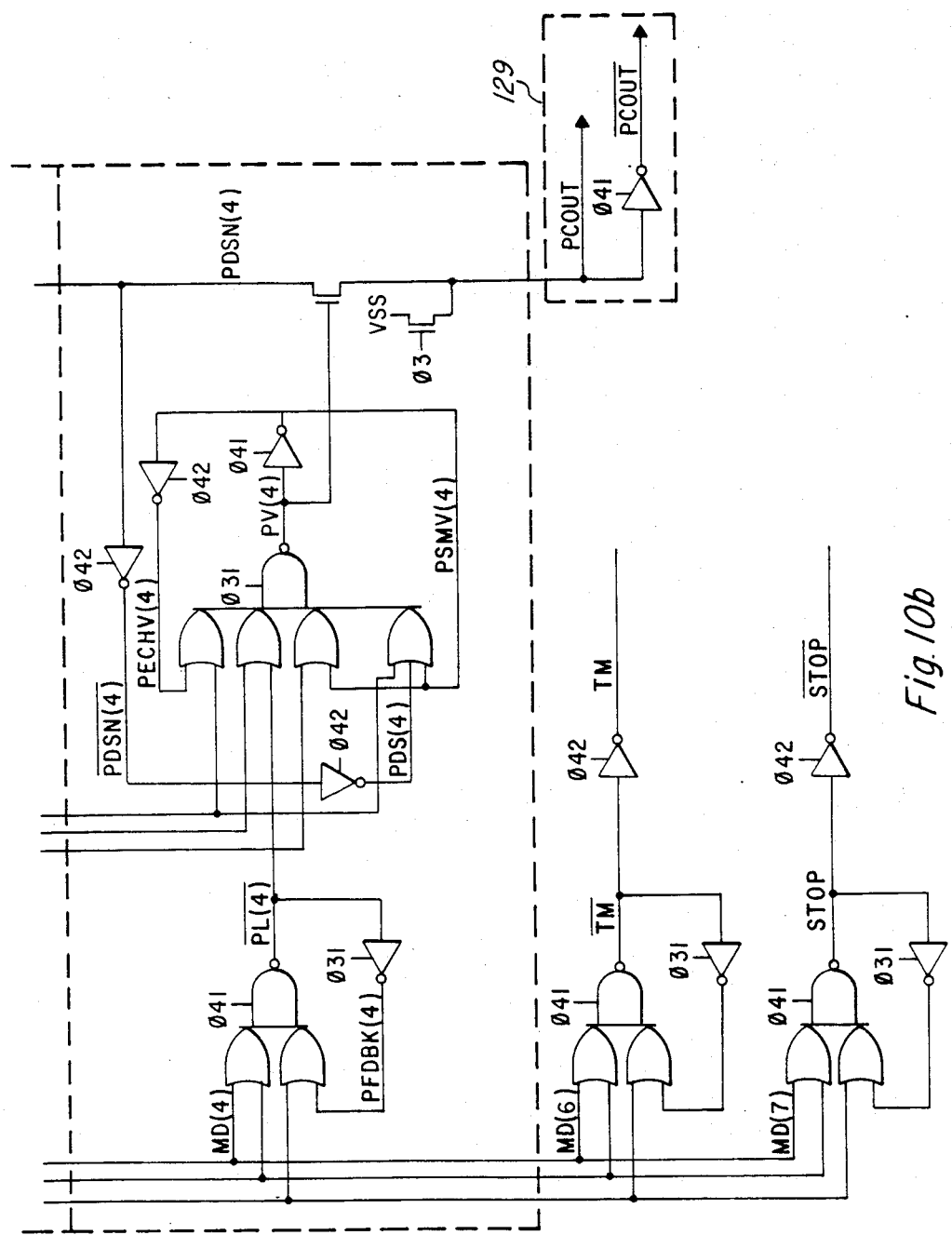

FIG. 10 illustrates the 5 bit prescaler circuit. Since all 5 bits are similar, only bits 0, 1 are 4 are illustrated. Only the bit 0 latch 120 will be discussed. These latches are similar to the latches of the timer in FIG. 9. Prescaler control latch 26a-1 for bit 0 (120) is illustrated and loads the control value from the MD bus under the control bus of PMDTL and PMDTL-. The output of this latch is PL(0)- and is input into the prescaler bit 0 counter 121 under the control of PLTV-. The prescaler bit 0 counter serves two functions similar to its timer counterpart. It first stores the value of the prescaler latch 120 and it decrements that value under the control of PDECH and PDECH-. The output of this prescaler for bit 0 is line 126 which is connected to the gate of device 125. Device 125 is used to compare the value of circuitry 121 with a 0. If the value is 0, then device 125 will pass a high signal contained on line 124 to node 127. The high signal on line 124 is prechared by inverter 123 and is similar to that discussed in FIG. 3. Therefore node 127 is charged and to produce an output via a circuitry 129, all other devices similar to 125 must also be turned on by the values in their respective prescaler bit positions. Note that node 127 is discharged periodically during $\phi 3$ by device 128.

As implemented in the timer in FIG. 9, this invention provides for the simultaneous comparison of all 8 bits in the timer to the 0 value to provide rapid evaluation of the timer contents. This enables the timer to evaluate when the 8 bit timer circuitry 26 has been decremented through the 0 value. When this occurs, the signals TCOUT and TCOUT- are appropriately generated. This implementation uses a counter clock $\phi 8$ or DB 8 which is the system clock divided by 8. It should be noted that in this implementation, the divide by 8 function is not required. Therefore with this specific embodiment, an external signal used to decrement the clock as shown in FIG. 4 is not restrained to the single clock times 8 as in the prior implementation. This invention will allow all the 8 bit timer storage bits to be compared to 0 and evaluated within a single clock cycle.

What we claim is:

1. A timer comprising:
   a multiple bit storage means for storing a numerical value as a plurality of binary bits;
   potential means representing a circuit defined value;
   an evaluation means for providing an output signal when the numerical value of the multiple bit storage means is equal to the circuit defined value, the evaluation means further comprises:
   a counter means for storing the plurality of binary bit and to periodically decrement, at a predetermined rate, the stored plurality of binary bits, the counter means having a plurality of bit stages with each stage having an output of a single binary bit;
   comparison circuit means for comparing the stored and decremented plurality of binary bits to the circuit defined value and to provide an indication signal when the numerical value of the stored and decremented plurality of binary bits is equal to the circuit defined value, the comparison circuit includes;
   a series connection of a plurality of transistor switch means with the gate of each transistor operably connected to a corresponding output of a bit stage and with one end of the series connection being connected to the potential means and the other end being the indicating signal output.

2. A storage device according to claim 1 wherein said circuit defined value is represented by a 0 voltage potential.

3. A storage device according to claim 1, wherein each of said transistor switch means includes a single metal oxide semiconductor field effect transistor further including a source drain and gate with said gate connected to said bit stage; said transistor switch means being serially connected together with said source of the metal oxide semiconductor field effect transistor being connected to said drain of a preceding metal oxide field effect transistor and with said source of a first metal oxide field effect transistor being connected to an output circuit to provide said source an active signal and said drain of a last metal oxide field effect transistor being connected to said potential means.

* * * * *